(12) United States Patent
Gerbsch et al.

(10) Patent No.: US 7,960,817 B2
(45) Date of Patent: Jun. 14, 2011

(54) SEMICONDUCTOR POWER MODULE WITH FLEXIBLE CIRCUIT LEADFRAME

(75) Inventors: Erich W. Gerbsch, Cicero, IN (US);
Robert D. Maple, Fishers, IN (US);
Monty B. Hayes, Kokomo, IN (US);
Robert J. Campbell, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 950 days.

(21) Appl. No.: 11/899,365

(22) Filed: Sep. 5, 2007

(65) Prior Publication Data
US 2009/0057853 A1    Mar. 5, 2009

(51) Int. Cl.
*H01L 23/495*    (2006.01)
(52) U.S. Cl. .. 257/675; 257/719; 257/712; 257/E23.051
(58) Field of Classification Search .................. 257/675, 257/719, 712, E23.051
See application file for complete search history.

(56) References Cited

U.S. PATENT DOCUMENTS

| 4,313,262 A | 2/1982 | Barnes et al. |
| 5,856,913 A * | 1/1999 | Heilbronner ................. 361/760 |
| 6,731,002 B2 * | 5/2004 | Choi ............................ 257/735 |
| 2005/0047186 A1 * | 3/2005 | Gerbsch et al. ................ 365/63 |

FOREIGN PATENT DOCUMENTS
EP    0372228    6/1990

OTHER PUBLICATIONS
European Search Report dated May 5, 2009.

* cited by examiner

*Primary Examiner* — Lynne A. Gurley
*Assistant Examiner* — Junghwa M Im
(74) *Attorney, Agent, or Firm* — Jimmy L. Funke

(57) ABSTRACT

A semiconductor power module includes a semiconductor chip thermally interfaced to a ceramic substrate and a leadframe defined by a flexible circuit disposed intermediate the chip and the ceramic substrate. The flexible circuit includes a conductor layer that is selectively encased in an insulated jacket to ensure adequate electrical insulation between the conductor layer and adjacent conductive surfaces. Preferably, the module is constructed for double side cooling by sandwiching the chip between a pair of ceramic substrates and providing intermediate flexible circuit leadframes on both sides of the chip for electrically accessing the chip terminals.

10 Claims, 5 Drawing Sheets

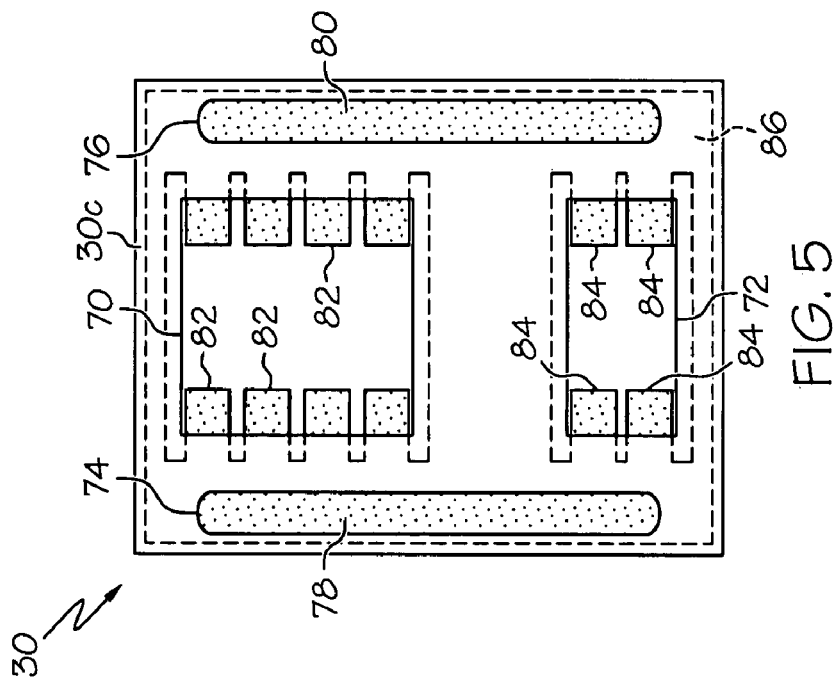
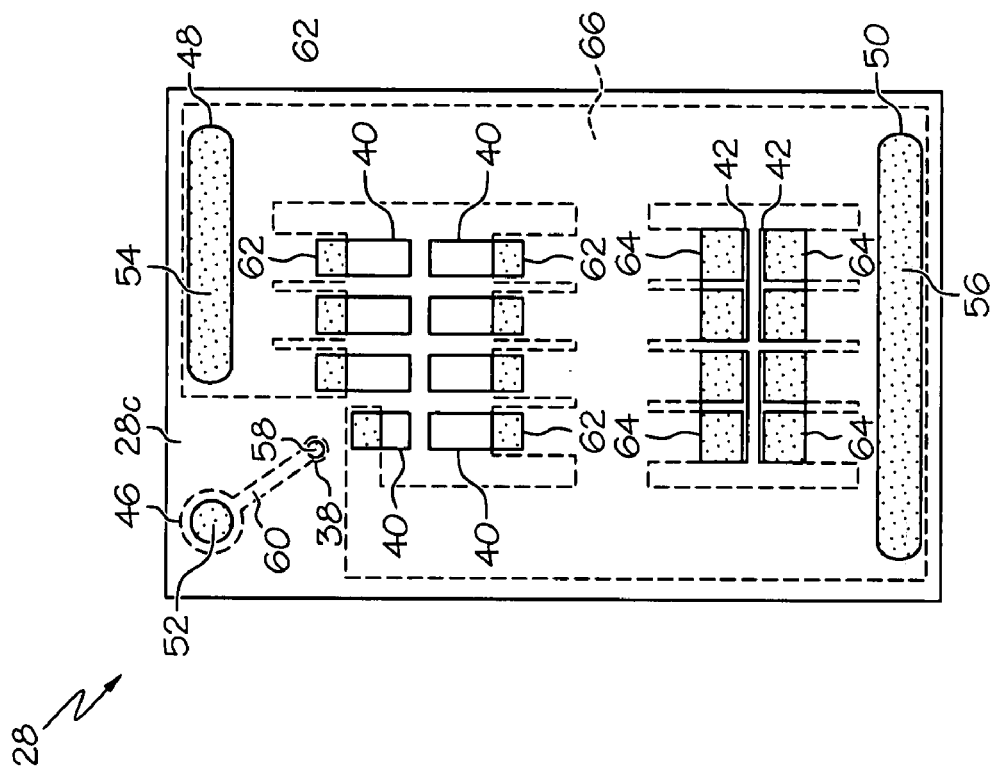

SEMICONDUCTOR POWER MODULE WITH FLEXIBLE CIRCUIT LEADFRAME

TECHNICAL FIELD

The present invention relates to a power module including at least one semiconductor chip, where the power module is clamped against a cold plate to dissipate heat generated by the chip, and more particularly to a power module having an improved leadframe arrangement for accessing electrical terminals of the chip.

BACKGROUND OF THE INVENTION

Semiconductor power modules house one or more semiconductor power devices such as transistors or diodes, and can be used as components of a power circuit such as a converter or inverter. Ordinarily, the electrical terminals of the chip are wire-bonded to a metal leadframe at the periphery of the chip, and the chip and leadframe can be sandwiched between a pair of ceramic substrates that dissipate heat generated by the chip. The modules are normally constructed as flat rectangular packages that can be clamped against a cold plate (or heat sink), or even sandwiched between a pair of cold plates for double-sided cooling. In the latter case particularly, it can be difficult to ensure that there will be adequate electrical insulation between the metal leadframe of the module and the adjacent cold plates, especially in high voltage applications. A related concern arises in connection with large semiconductor transistor chips such as IGBTs and FETs where the gate terminal is coupled to segmented emitter or source terminals by an array of exposed conductive links because of the close proximity of the metal leadframe to the gate terminal links. Accordingly, what is needed is an improved semiconductor power module leadframe arrangement that is adequately insulated against inadvertent electrical shorting.

SUMMARY OF THE INVENTION

The present invention is directed to an improved semiconductor power module including a semiconductor chip thermally interfaced to a ceramic substrate for heat dissipation and a leadframe defined by a flexible circuit disposed intermediate the chip and the ceramic substrate. The flexible circuit comprises an inner conductor pattern that is selectively encased in an insulated jacket to ensure adequate electrical insulation between the leadframe conductor pattern and adjacent conductive surfaces. Preferably, the module is constructed for double side cooling by sandwiching the chip between a pair of ceramic substrates and providing intermediate flexible circuit leadframes on both sides of the chip for electrically accessing the chip terminals. In modules including two or more semiconductor chips, separate ceramic substrates are provided for each chip for low cost and to accommodate different chip thicknesses, and a single flexible circuit leadframe provides electrical interconnects to all of the chips.

BRIEF DESCRIPTION OF THE DRAWINGS

FIG. 4 depicts the lower face of an upper flexible circuit leadframe of the semiconductor power module of FIG. 1;

FIG. 5 depicts the lower face of a lower flexible circuit leadframe of the semiconductor power module of FIG. 1;

DESCRIPTION OF THE PREFERRED EMBODIMENT

The present invention is directed to a power electronics module including one or more power semiconductor devices such as transistors and diodes that have solderable active areas on their opposing faces. For example, an insulated gate bipolar power transistor, or IGBT, typically has a solderable collector terminal formed on one of its faces and solderable gate and emitter terminals formed on its opposite face. The invention is described herein in the context of a power transistor switch including an IGBT (or FET) and a free-wheeling or anti-parallel diode, but it will be appreciated that the invention is applicable in general to power electronics modules including different numbers and kinds of power semiconductor devices.

Figure 1:
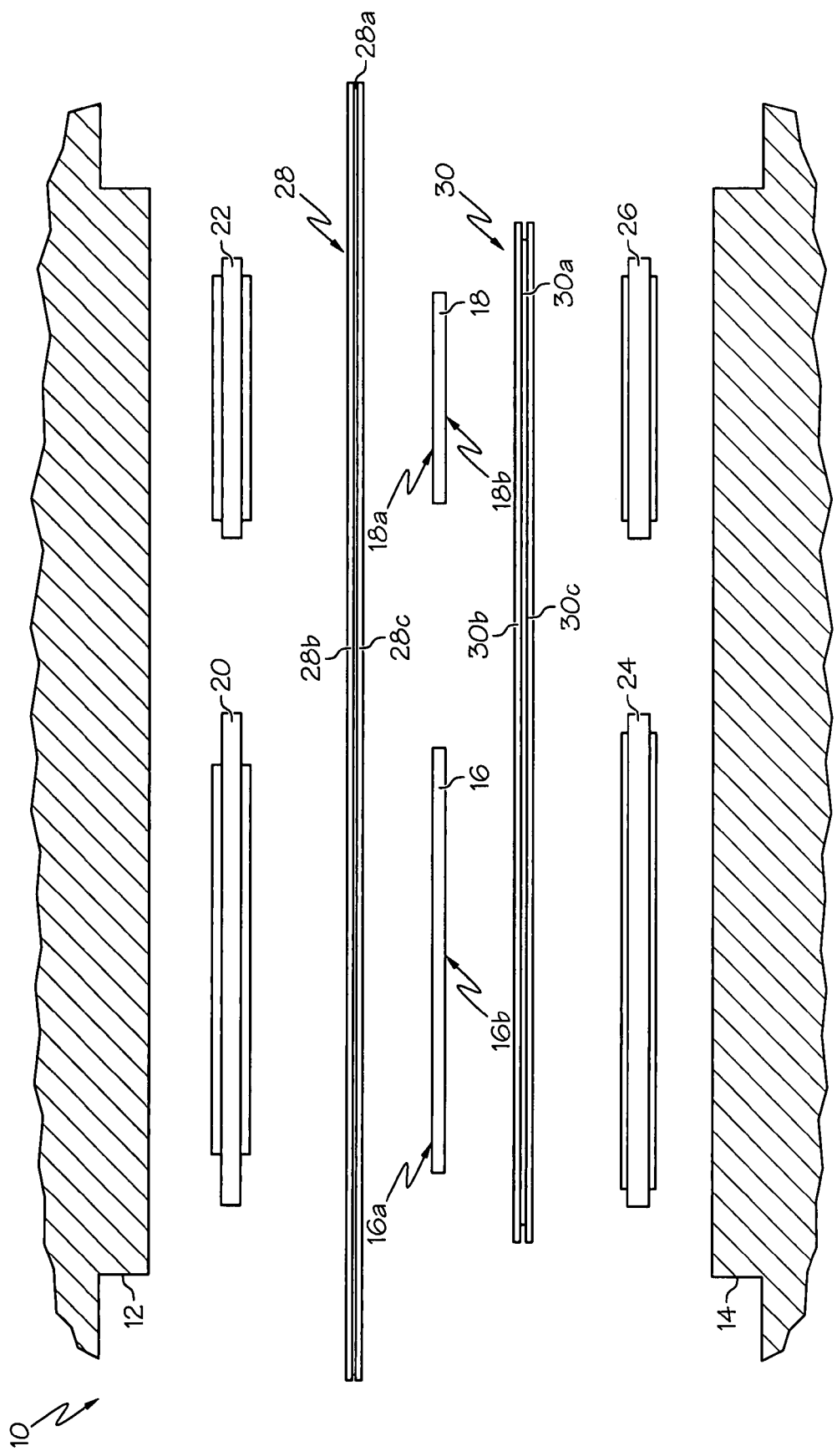
FIG. 1 is an exploded side view of an actively or passively cooled semiconductor power module according to this invention.
Figure 2:
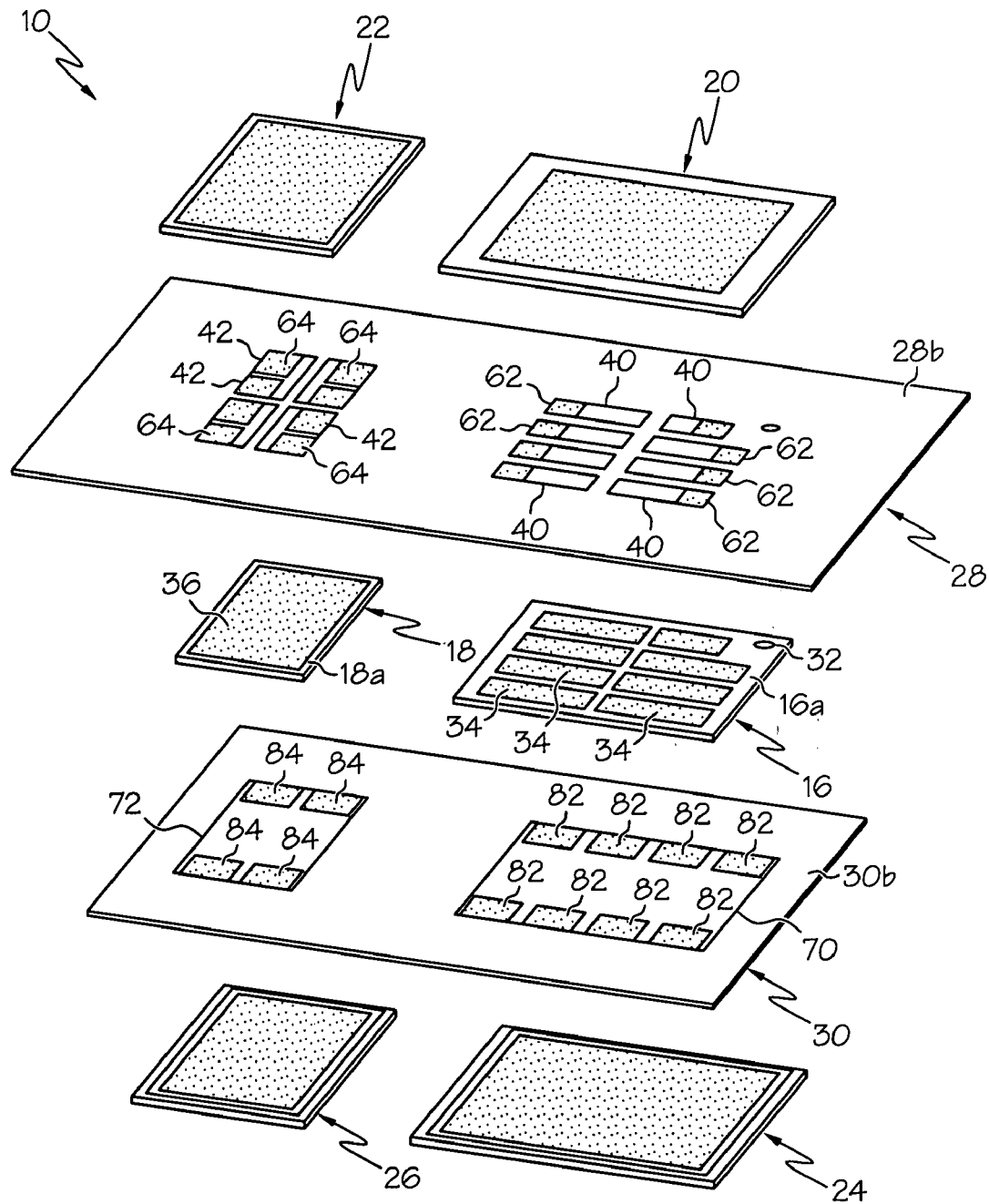
FIG. 2 is an exploded isometric top view of the semiconductor power module of FIG. 1.
Figure 3:
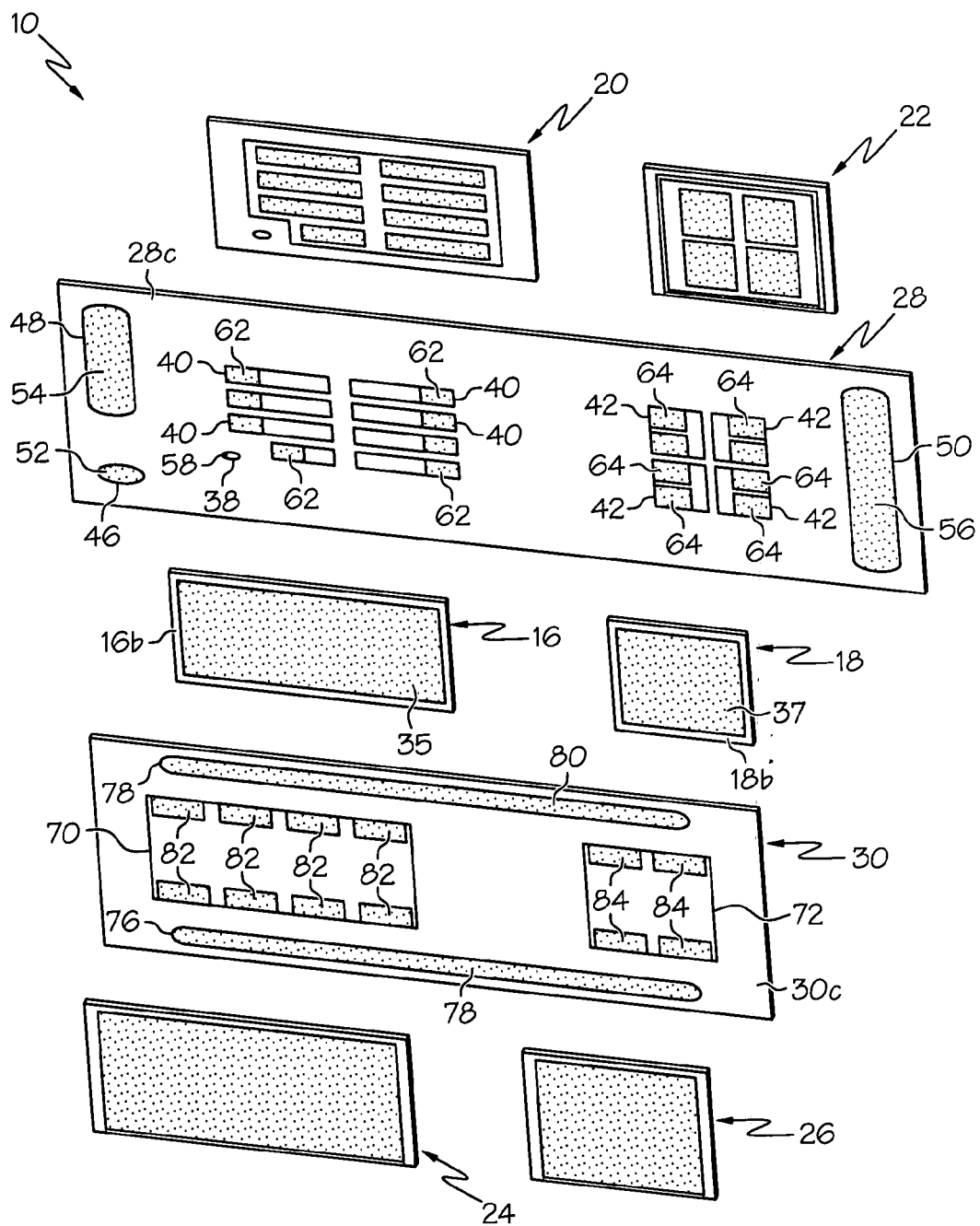
FIG. 3 is an exploded isometric bottom view of the semiconductor power module of FIG. 1.
Figure 7:
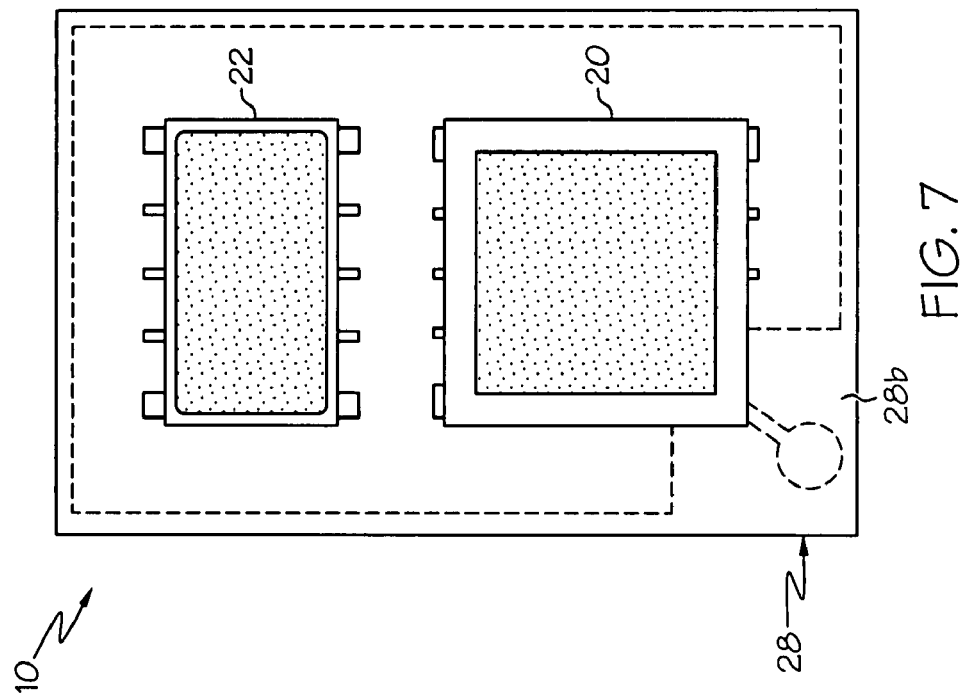
FIG. 7 is a top view of the semiconductor power module of FIG. 1.

Referring to the drawings, and particularly to FIG. 1, the reference numeral 10 generally designates a semiconductor power module according to this invention designed for double-side cooling by upper and lower cold plates 12 and 14. Referring to FIGS. 1-3, the illustrated module 10 houses two semiconductor chips 16 and 18. The upper face 16a of chip 16 is thermally coupled to the upper cold plate 12 through a first upper ceramic substrate 20, and the upper face 18a of chip 18 is thermally coupled to upper cold plate 12 through a second upper ceramic substrate 22. Similarly, the lower face 16b of chip 16 is thermally coupled to the lower cold plate 14 through a first lower ceramic substrate 24, and the lower face 18b of chip 18 is thermally coupled to lower cold plate 14 through a second lower ceramic substrate 26. An upper flexible circuit leadframe 28 is disposed intermediate the chips 16, 18 and the upper ceramic substrates 20, 22 for electrically accessing terminals formed on the upper faces 16a and 18a of chips 16 and 18. And similarly, a lower flexible circuit leadframe 30 is disposed intermediate the chips 16, 18 and the lower ceramic substrates 24, 26 for electrically accessing terminals formed on the lower faces 16b and 18b of chips 16 and 18. As illustrated in FIG. 1, the upper and lower flexible circuit leadframes 28 and 30 each comprise a patterned copper layer 28a and 30a sandwiched between a pair of patterned insulation layers 28b, 28c and 30b, 30c.

For purposes of discussion, it will be assumed that chip 16 is an insulated-gate-bipolar-transistor (IGBT) and that chip 18 is a free-wheeling or anti-parallel diode. Referring to FIG. 2, the IGBT gate terminal 32 and a segmented array of IGBT emitter terminals 34 are formed on the upper face 16a of chip 16. The diode anode terminal 36 is formed on the upper face 18a of chip 18. Referring to FIG. 3, the IGBT collector terminal 35 is formed on the lower face 16b of chip 16, and the diode cathode terminal 37 is formed on the lower face 18b of chip 18.

Referring to FIGS. 2-3 and 4, the insulation layers 28b and 28c of upper flexible circuit leadframe 28 are patterned to provide an array of un-insulated regions 38, 40, 42 that correspond and register with the gate, emitter and anode terminals 32, 34 and 36. Additionally, the inboard insulation layer 28c is patterned to provide a set of three peripheral un-insulated regions 46, 48 and 50 for external access to the terminals 32, 34 and 36 via the exposed leadframe copper areas 52, 54 and 56 of copper layer 28a. An exposed leadframe copper pad 58 in the un-insulated region 38 is soldered to the gate terminal 32 of chip 16, and an insulated leg 60 of the copper layer 28a electrically joins the copper pad 58 to the exposed peripheral copper area 52, which serves as the gate terminal of the module 10. Exposed leadframe copper pads 62 in the un-insulated regions 40 are soldered to the emitter terminals 34 of chip 16, and exposed leadframe copper pads 64 in the un-insulated regions 42 are soldered to the anode terminal 36 of chip 18. An insulated portion 66 of the copper layer 28a electrically joins the copper pads 62 and 64 to the exposed peripheral copper areas 54 and 56. Thus, the insulated portion 66 of the copper layer 28a serves to electrically couple the emitter terminals 34 of chip 16 to the anode terminal 36 of chip 18, and to provide electrical access to the joined emitter and anode terminals 34, 36 at the peripheral copper areas 54 and 56, which serve as low voltage terminals for the module 10.

Referring to FIGS. 2-3 and 5, the insulation layers 30b and 30c of lower flexible circuit leadframe 30 are patterned to provide an array of un-insulated regions 70 and 72 that correspond and register with the collector and cathode terminals 35 and 37 of chips 16 and 18. Additionally, the outboard insulation layer 30c is patterned to provide a set of two peripheral un-insulated regions 74 and 76 for external access to the terminals 35 and 37 via the exposed leadframe copper areas 78 and 80 of copper layer 30a. Exposed leadframe copper pads 82 in the un-insulated region 70 are soldered to the collector terminal 35 of chip 16, and exposed leadframe copper pads 84 in the un-insulated region 72 are soldered to the cathode terminal 37 of chip 18. As seen in FIG. 5, an insulated portion 86 of the copper layer 30a electrically joins the copper pads 82 and 84 to the exposed peripheral copper areas 78 and 80. Thus, the insulated portion 86 of the copper layer 30a serves to electrically couple the collector terminal 35 of chip 16 to the cathode terminal 37 of chip 18, and to provide electrical access to the joined collector and cathode terminals 35, 37 at the peripheral copper areas 78 and 80, which serve as high voltage terminals for the module 10.

Figure 6:
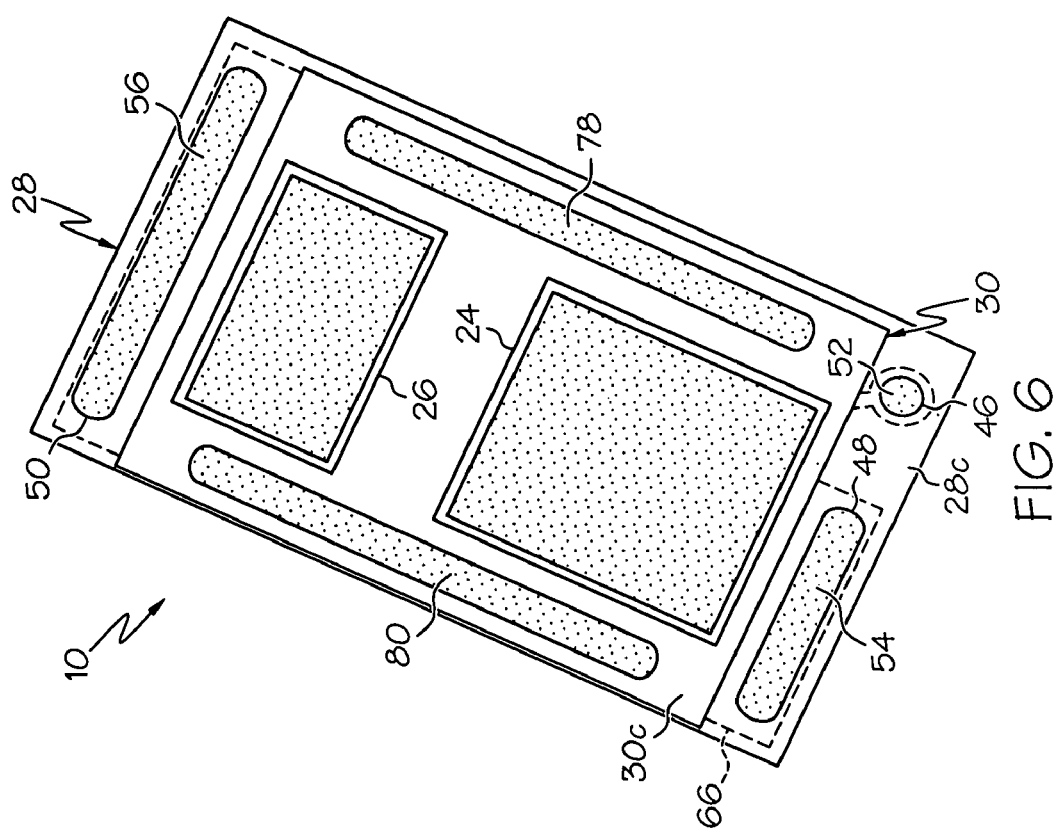
FIG. 6 is an isometric bottom view of the semiconductor power module of FIG. 1.

As best seen in FIG. 6, the gate terminal 52 and emitter/anode terminals 54, 56 provided on upper flexible circuit leadframe 28 and the collector/cathode terminals 78, 80 provided on lower flexible circuit leadframe 30 are all accessible on the same (lower) side of module 10. The upper flexible circuit leadframe 28 extends laterally beyond the lower flexible circuit leadframe 30 so that the lower flexible circuit leadframe 30 does not cover the gate and emitter/anode terminals 52, 54, 56 of upper flexible circuit leadframe 28. Of course, the terminals 52, 54, 56, 78, 80 may be variously arranged to accommodate the requirements of a given application, and the flexible nature of the leadframes 28, 30 allows the terminal portions to be bent out of the plane of the chips 16, 18 for connection to an external circuit board or bus bar, if desired.

As seen in FIGS. 2-3 and 6-7, the outboard surfaces of the upper and lower ceramic substrates 20-26 are each clad with a metal layer (such as copper, aluminum, or any conventional thick film or thin film conductor formulation) to promote heat transfer from the module 10 to the upper and lower cold plates 12 and 14. Additionally, the inboard surfaces of the substrates 20-26 bear a metal cladding that is soldered to the chips 16, 18 and the flexible circuit leadframes 28, 30. Referring to FIG. 2-3, for example, the inboard face of upper ceramic substrate 20 is clad with a metallization pattern that matches and registers with the gate and emitter terminals 32, 34 of chip 16. The substrate's metallization pattern is soldered to the exposed copper pads 52 and 62 of upper flexible circuit leadframe 28, as well as the emitter terminals 34 of chip 16. And of course, the exposed copper pads 52 and 62 of leadframe 28 are soldered to the gate and emitter terminals 32 and 34 of chip 16. Corresponding solder joints are formed between each ceramic substrate 20-26 and the adjacent chip terminals and leadframe copper pads.

In summary, the present invention provides an improved semiconductor power module leadframe arrangement. The disclosed leadframe arrangement offers numerous advantages when compared with conventional discrete metal leadframes. First, the use of selectively insulated flexible circuit leadframes ensures that all metal runners between soldered connections are electrically insulated from adjacent conductive components such as the cold plates 12 and 14. Furthermore, the flexible circuit leadframes and improved cooling allow the module 10 to be considerably thinner than a conventionally semiconductor power module. The module 10 is relatively inexpensive to produce as well because the overall ceramic substrate surface area is considerably reduced compared to a module in which multiple chips are soldered to the same substrate. In the same vein, using separate ceramic substrates for each chip of a multi-chip module enables the use of chips having different thicknesses.

While the present invention has been described in reference to the illustrated embodiment, it will be understood that numerous modifications and variations in addition to those mentioned above will occur to those skilled in the art. For example, the disclosed apparatus is applicable to modules housing a different number of chips, just one flexible circuit leadframe, and so on. Additionally, the flexible circuit terminals 54-56, 78-80 may be arranged to accommodate planar (i.e., non-pedestal) cold plates 12, 14, if desired, and so forth. Accordingly, it is intended that the invention not be limited to the disclosed embodiment, but that it have the full scope permitted by the language of the following claims.

The invention claimed is:
1. A semiconductor power module, comprising:
a semiconductor chip having a first face on which is formed a first active area and a second face on which is formed a second active area;
a first heat dissipative element for dissipating heat generated by the semiconductor chip;
a first multi-layer flexible circuit leadframe disposed between the first face of the semiconductor chip and the first heat dissipative element, including a conductor layer sandwiched between a first pair of insulation layers, the first pair of insulation layers being patterned to provide a first inner un-insulated region of said conductor layer in registry with the first active area of said semiconductor chip, and a first outer un-insulated region of said conductor layer that is disposed laterally outboard of said semiconductor chip and said first heat dissipative element for providing electrical access to the first active area of said semiconductor chips;
a second heat dissipative element for dissipating heat generated by the semiconductor chip; and
a second multi-layer flexible circuit leadframe disposed between the second face of the semiconductor chip and the second heat dissipative element, including a conductor layer sandwiched between a second pair of insulation layers, the insulation layers being patterned to provide a second inner uninsulated region of said conductor layer in registry with the second active area of said semiconductor chip, and a second outer un-insulated region of said conductor layer that is disposed laterally outboard of said semiconductor chip and said second heat dissi- pative element for providing electrical access to the second active area of said semiconductor chip, wherein the first multi-layer flexible circuit leadframe extends laterally beyond the second multi-layer flexible circuit leadframe and the first and second multi-layer flexible circuit leadframes exhibit a flexible nature, whereby the flexible nature of the first and second multi-layer flexible circuit leadframe allows the first and second multi-layer flexible circuit leadframes to be bent so that all of the terminal connections to said semiconductor power module can be made from a single side of said semiconductor power module.

2. The semiconductor power module of claim 1, where:
said first heat dissipative element has a solderable surface facing said first multi-layer flexible circuit leadframe;
said first inner un-insulated region of said conductor layer is patterned to place a portion of the first active area of said semiconductor chip adjacent the solderable surface of said first heat dissipating element; and
said portion of the first active area of said semiconductor chip is soldered to the solderable surface of said first heat dissipating element.

3. The semiconductor power module of claim 2, where:
said first inner un-insulated region of said conductor layer is soldered to the first active area of said semiconductor chip and to the solderable surface of said first heat dissipative element.

4. The semiconductor power module of claim 1, where:
said first heat dissipative element includes a ceramic substrate.

5. The semiconductor power module of claim 1, where:
said second heat dissipative element has a solderable surface facing said second multi-layer flexible circuit leadframe;
said second inner un-insulated region of said conductor layer is patterned to place a portion of the second active area of said semiconductor chip adjacent the solderable surface of said second heat dissipating element; and
said portion of the second active area of said semiconductor chip is soldered to the solderable surface of said second heat dissipative element.

6. The semiconductor power module of claim 5, where:
said second inner un-insulated region of said conductor layer is soldered to the second active area of said semiconductor chip and to the solderable surface of said second heat dissipative element.

7. The semiconductor power module of claim 1, where:
said second heat dissipative element includes a ceramic substrate.

8. A semiconductor power module, comprising:
first and second semiconductor chips, each having upper and lower opposing faces on which are formed electrical terminals, and each being disposed between respective upper and lower heat dissipative elements;
an upper flexible circuit leadframe disposed between the upper heat dissipative elements and the upper faces of the semiconductor chips, the upper flexible circuit leadframe including a selectively insulated conductor layer having un-insulated inner regions in registry with the electrical terminals formed on the upper faces of said semiconductor chips, and un-insulated peripheral regions that are electrically linked to the un-insulated inner regions to provide electrical access to the electrical terminals formed on the upper faces of said semiconductor chips; and
a lower flexible circuit leadframe disposed between the lower heat dissipative elements and the lower faces of the semiconductor chips, the lower flexible circuit leadframe including a selectively insulated conductor layer having un-insulated inner regions in registry with the electrical terminals formed on the lower faces of said semiconductor chips, and un-insulated peripheral regions that are electrically linked to the un-insulated inner regions to provide electrical access to the electrical terminals formed on the lower faces of said semiconductor chips, wherein the upper flexible circuit leadframe extends laterally beyond the lower flexible circuit leadframe and the upper and lower flexible circuit leadframes exhibit a flexible nature, whereby the flexible nature of the upper and lower flexible circuit leadframe allows the upper and lower flexible circuit leadframe to be bent so that all of the terminal connections to said semiconductor power module can be made from a single side of said semiconductor power module.

9. The semiconductor power module of claim 8, where:
the un-insulated inner regions of said upper and lower flexible circuit leadframes are patterned to thermally couple the electrical terminals formed on the upper and lower faces of said semiconductor chips with respective upper and lower heat dissipating elements.

10. The semiconductor power module of claim 8, where:
the upper and lower heat dissipative elements of said first semiconductor chip and the upper and lower heat dissipative elements of said second semiconductor chip are of a different thickness to accommodate different thickness of said first and second semiconductor chips.

* * * * *